United States Patent [19]

Peil

[11] 3,838,210

[45] Sept. 24, 1974

[54] AUTOMATIC GAIN CONTROL SYSTEM AND AMPLIFIER OF CONTROLLABLE GAIN

[75] Inventor: William Peil, North Syracuse, N.Y.

[73] Assignee: General Electric Corporation, Syracuse, N.Y.

[22] Filed: Oct. 1, 1973

[21] Appl. No.: 402,073

[52] U.S. Cl. .......... 178/7.3 R, 178/7.3 DC, 339/29, 330/30 D, 330/153

[51] Int. Cl. .......... H04n 5/52

[58] Field of Search .......... 330/29, 30 D, 133, 134, 330/138, ; 325/319; 178/7.3 R, 7.3 DC, 7.5 DC, DIG. 26

[56] References Cited

UNITED STATES PATENTS 3,641,450 2/1972 Lunn .......... 330/29 X

*Primary Examiner*—Herman Karl Saalbach
*Assistant Examiner*—James B. Mullins
*Attorney, Agent, or Firm*—Richard V. Lang; Carl W. Baker; Frank L. Neuhauser

[57] ABSTRACT

An automatic gain control system incorporating a novel amplifier of controllable gain is described. The amplifier is d.c. coupled throughout and capable of wideband operation. It employs a cascoded differential transistor amplifier for producing the principal voltage gain supplemented by input and output emitter followers. Gain control is achieved by the application of gain control potentials to the bases of the upper rank transistors. Gain reduction is produced first in the upper rank by the controlled degeneration produced by a pair of nonlinear impedances in series with the emitter leads of the upper rank transistors, and sequentially in the lower rank transistors by the controlled degeneration produced by two pairs of nonlinear impedances coupled in a degenerative feedback path about the lower rank transistors and in the input circuit to a pair of input emitter followers. In addition, the amplifier produces an indication of gain control action which, when the amplifier is used as an intermediate frequency amplifier of a television system, permits one to derive a second gain control signal, which after thresholding may be used for further gain reduction in the tuner. The amplifier is adapted for integrated circuit fabrication.

9 Claims, 5 Drawing Figures

AUTOMATIC GAIN CONTROL SYSTEM AND AMPLIFIER OF CONTROLLABLE GAIN

BACKGROUND OF THE INVENTION

1. Field of the Invention

The present invention relates to AGC systems designed for control of both the IF amplifier and the tuner of a television receiver. It also relates to d.c. coupled amplifiers capable of wideband operation and susceptible of electrical gain control. The AGC system herein proposed is designed to provide successive reductions in gain in the IF amplifier and in the tuner so as to achieve a maximum noise quieting. The amplifier is adapted to amplify the television signal at customary intermediate frequencies with the amplification being subject to control as a function of the signal level in a subsequent detection stage.

2. Description of the Prior Art

In a conventional television receiver, amplification of a television signal occurs at a typical intermediate frequency of 44 MHz. With the advent of integrated circuits it became desirable to develop amplifiers for this task using integrated circuit techniques. Integrated circuit fabrication requirements dictated that the amplifiers be d.c. coupled throughout. This made it necessary to improve on existent d.c. amplifier designs so as to encompass the high frequency response required for television signal amplification. Once the necessary frequency response had been obtained, it was essential that the other requirements of an intermediate frequency amplifier also be obtained such as amplification linearity, balance, noise figure, and accurate automatic gain control.

The present invention is an improvement over amplifiers disclosed in US. Pat. No. 3,731,215 and 3,723,895 assigned to the present assignee, which represent earlier inventions of the present inventor. U.S. Pat No. 3,731,215 describes an amplifier employing two differential amplifiers with interspersed buffer amplifiers and a d.c. balancing feedback network. Gain control is achieved by control supplied to both differential amplifier stages. The second U.S. Pat. No. 3,723,895 describes a cascoded differential amplifier followed by a second differential amplifier for producing additional gain that is not subject to gain control. Gain reduction is successively produced by saturation of the lower rank transistors of the cascoded amplifier, the degenerative effects of impedances connected in series with the base leads of the lower rank transistors, and finally by cutoff of the upper rank transistors.

The present invention seeks to achieve the same general objectives as these earlier inventions with improved performance in certain specifics. In particular, equal or improved performance has been achieved in terms of of the noise figure, the formation of intermodulation terms, noise quieting, dynamic range. In addition, the present amplifier configuration has permitted one to avoid the need for an additional stage of differential amplification and at the same time provided means for achieving accurate delayed automatic gain control of the tuner.

SUMMARY OF THE INVENTION

It is a principal object of the present invention to provide an amplifier having improved automatic gain control action.

It is another object of the present invention to provide an improved cascoded differential amplifier suitable for intermediate frequency amplification of a television signal and exhibiting improved gain control action.

It is still another object of the present invention to provide an automatic gain control system for a television receiver wherein improved means are provided for controlling the withdrawal of gain from the intermediate frequency amplifier and from the tuner.

These and other objects of the invention are achieved in an AGC amplifier comprising: a first pair of transistors connected in emitter follower configuration, and having an input circuit for differentially applying the input signal to the bases thereof with the output signal appearing differentially at the emitters thereof; a second pair of transistors connected in differential amplifier configuration, each having a base d.c. coupled to an emitter of one said first pair of transistors; and each having a load circuit including a first forward poled diode and resistance in shunt therewith coupled to each collector; a third pair of transistors connected in cascode with said second transistor pair, each emitter of said third pair being d.c. coupled through one of said load circuits to a collector of said second pair in a current path branched at said collector, the output signal appearing differentially at the collectors of said third pair; a feedback circuit for the associated transistors of said first and second pairs including a second diode pair, each diode being connected between the collector of a transistor of said second pair and the base of the associated one of said first pair of transistors and forming a first one of said collector connected branches, the diodes of said second pair being normally reversely poled, said input circuit providing a low impedance path for forward current through said second diode pair; means for coupling a gain control voltage to the bases of said third transistor pair for reducing the emitter current of said third transistor pair and by emitter follower action, reducing the collector voltage of said second transistor pair; and control means for sequentially reducing the reverse bias of said first diode pair to cause gain reducing degeneration in said third transistor pair, a next for forward biasing said second, normally reversely poled second diode pair to cause gain reducing degeneration in said first and second transistor pairs as said gain control voltage increases.

In accordance with a further aspect of the invention the control means includes means for stabilizing the emitter current in the second transistor pair as gain is reduced. The control means in turn comprises a current sensing resistance coupled in the emitter path of said second transistor pair; a current sensing transistor amplifier having its base coupled to said resistance, and producing an amplified indication of the emitter current level in said second transistor pair, and stabilizing means responsive to said amplified current indication for stabilizing the voltage at the bases of said first transistor pair and for injecting current into a collector connected branch of each transistor of said second pair to stabilize the emitter current in said second transistor pair against reductions in emitter current of said third transistor pair.

The stabilizing means preferrably comprises a first current injecting transistor in emitter follower configuration, whose base is coupled to the output of said current sensing transistor amplifier, and whose emitter is d.c. coupled to the collectors of said second transistor pair.

In accordance with a further aspect of the invention, the input circuit is a double ended input circuit comprising a resistance serially connected in each signal path and a second pair of serially connected resistors and a third pair of serially connected diodes, with one like electrode of one diode connected to a like electrode of the other diode, the last recited resistor pair and the third diode pair shunting the bases of said first transistor pair and being jointed at their interconnection points to form an a.c. ground of variable d.c. potential for said first transistor pair. In addition, the stabilizing means further includes a second current injecting transistor, in base input configuration, whose emitter is coupled to said a.c. ground; the input junction of said current injecting transistor, said second diode pair and said third diode pair being similarly poled for substantial serial current flow, whereby upon application of a predetermined gain control voltage which reduces the collector potential of said second pair of transistors that forward bias to said second diode pair is provided, such that said second diode pair, said third diode pair, and said current injecting transistor become simultaneously conductive to provide additional current into a collector connected branch of each transistor of said second pair.

Preferably, the first current injecting transistor is adjusted to inject current into the collector connected branch prior to current injection from said second current injecting transistor, so that the forward bias of the first diode pair is removed prior to forward biasing of said second diode pair. By this means, gain reduction in the upper rank transistors is completed before gain reduction in said lower rank transistors is initiated.

The shunting resistor pair has resistance values proportioned to provide small input signal loading to permit high gain operation of the lower rank transistor pair when the second diode pairs are nonconductive, said third diode pair upon becoming conductive simultaneously with said second diode pair, and thereupon causing an increase in input signal loading and a consequent gain reduction.

The amplifier may be the portion of an improved AGC system involving a tuner, also of controllable gain, connected to be responsive to current from the second current injecting transistor. When this is done, first thresholding means is provided responsive to an AGC voltage developed from sensing detected synchronizing pulses in a received television signal. This voltage is applied to the intermediate frequency amplifier. In addition, a second thresholding means is provided for application of a gain control potential to the tuner. The second thresholding means applies a control potential when the current in the second current injecting transistor exceeds a predetermined threshold level corresponding to a predetermined amount of gain withdrawal from the lower rank of the intermediate frequency amplifier, the second thresholding means preferably sensing the current from the collector of said second current injecting transistor.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

DESCRIPTION OF THE PREFERRED EMBODIMENT

Figures 1, 3A, 3B, 3C:
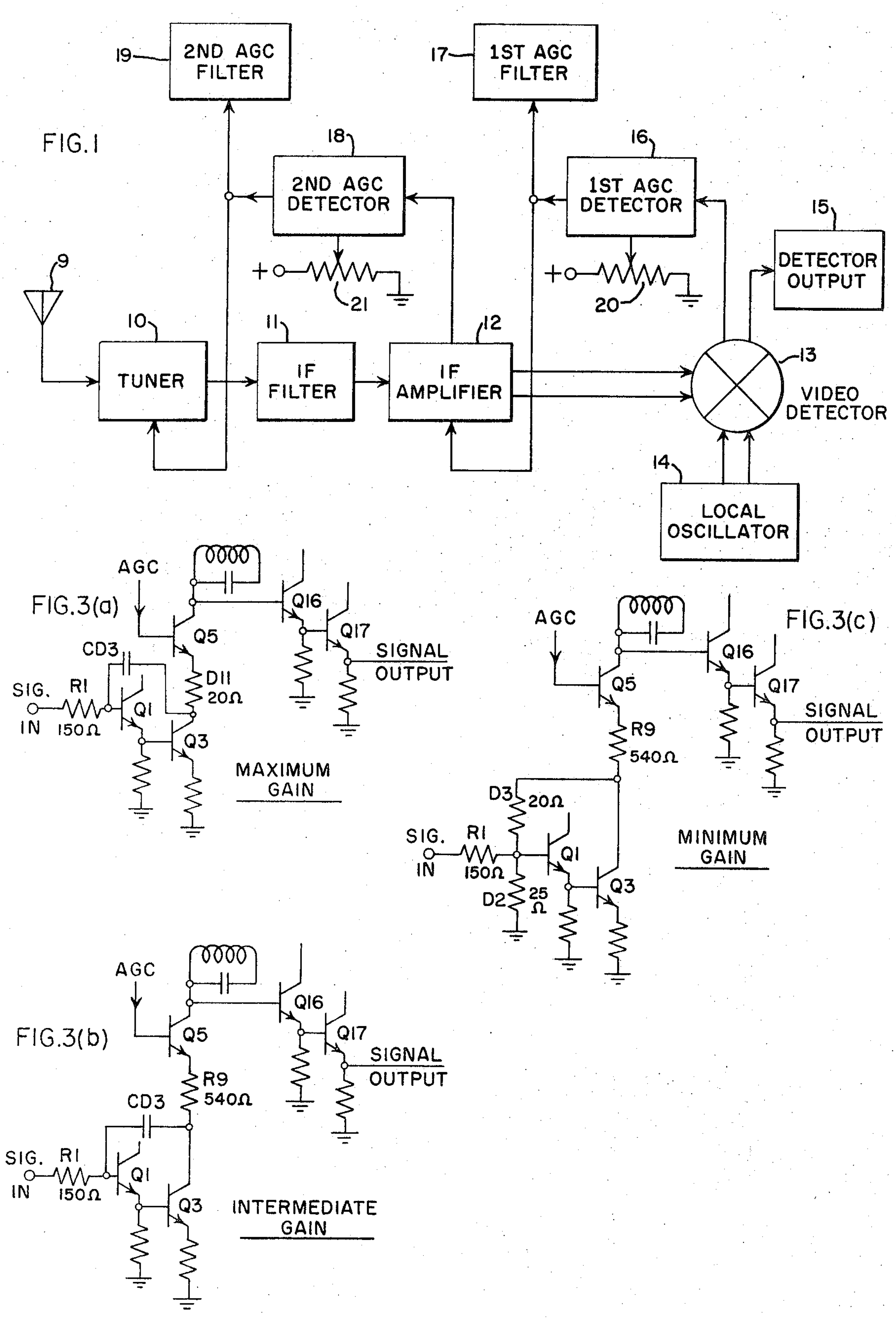
FIG. 1 is a block diagram of an automatic gain control system in accordance with the invention which is suitable for use in a television receiver.
FIGS. 3(a), 3(b) and 3(c) are simplified schematic diagrams illustrating three states of gain in the AGC system.

FIG. 1 is a block diagram of a television receiver using synchronous detection and incorporating the present automatic gain control invention. The television receiver comprises the functional blocks 10 through 21. As illustrated, an antenna 9 is provided for coupling television signals to a tuner. The tuner 10 selects a signal channel, applies it to an IF filter 11 which provides adjacent channel suppression. The selected signal is then coupled to an IF amplifier 12 which amplifies the signal to a level suitable for detection. Both the tuner 10 and the IF amplifier 12 are variable gain amplifiers provided with connections to a source of automatic gain control voltage shortly to be described. The amplified signal at the output of the IF amplifier 12 is coupled to the synchronous video detector 13.

The video detector, from which the television signal components and the automatic gain control voltage are derived, is a four quadrant multiplier which has two pairs of complementary input connections and a single pair of complementary output connections. The signal at intermediate frequency is applied to one detector input pair and a wave at intermediate frequency from local oscillator 14 is applied to the other detector input pair. When the local oscillator is at the proper frequency and phase, the television signal is synchronously detected by a multiplication process. The demodulated output contains the luminance signal at base band, including the vertical and horizontal pulses, and the color burst; the chrominance signal on its color subcarrier, and the audio signal on its carrier. These components appear at both of the complementary detector outputs. The sound, luminance, chrominance, and control signals derived from one demodulator output terminal are subsequently separated and coupled to the detector output 15.

One complementary detector output provides the input to the first AGC detector 16. The AGC detector is provided with a variable threshold 20 and a filter 17. The variable threshold of the AGC detector is adjusted to pass some desired fraction of the tips of the synchronizing pulses, and generally to prevent the entry into the AGC control loop of the video, chrominance, or audio components. The AGC filter 17 is an integrating capacitor designed to derive a smoothed voltage derived primarily from the horizontal sync pulses. The threshold detector produces a control voltage representative of the voltage of the horizontal synchronizing pulses in excess of the threshold as measured at the demodulator output. Since the synchronizing pulses bear a fixed relation to the maximum video modulation, it is normal to adjust the gain of the controlled amplifier stages so that the synchronizing pulses reach a desired level in the demodulator output.

Thus, after filtering in 17 the control voltage is applied to the gain control connection of the IF amplifier 12. The IF amplifier 12 is of controllable gain, as earlier noted, and is provided with novel circuitry which produces a signal indicating the amount of gain withdrawal from the IF amplifier. This signal is then applied to the second AGC detector 18, which also has a threshold 21 and a filter 19. Upon the second threshold being exceeded, the AGC detector produces a gain controlling output voltage, which is further filtered and applied to the gain control connection of the tuner 10 to withdraw further gain from the tuner.

Figure 2:
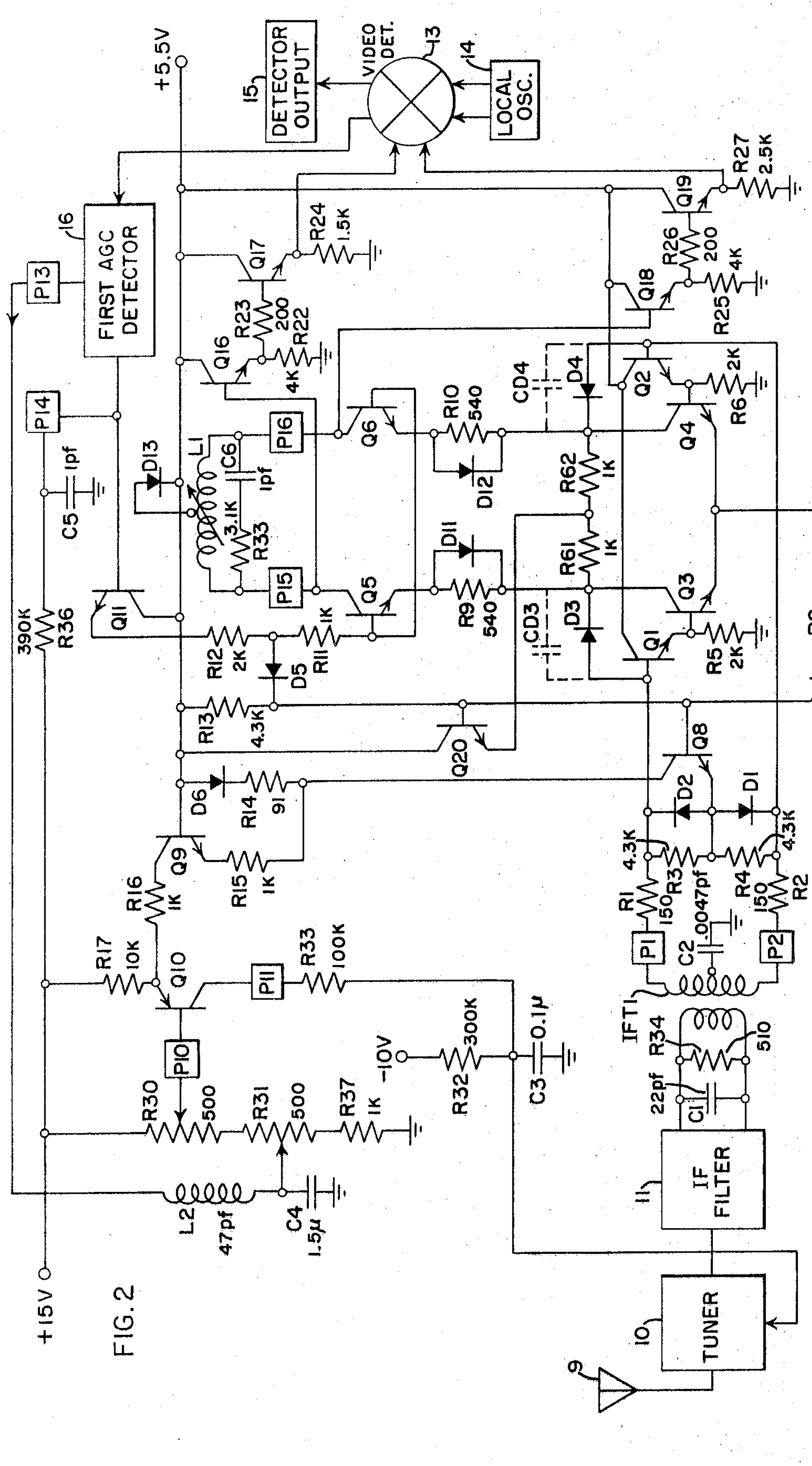
FIG. 2 is a mixed block diagram and circuit diagram wherein the novel elements of the automatic gain control system are illustrated in electrical circuit diagram form.

The circuitry of the novel elements of the foregoing automatic gain control system are shown in FIG. 2. Of the several elements in the block diagram those of particular interest are the IF amplifier 12 and the means for coupling a signal to the second AGC detector 18. The other elements of the block diagram may be of conventional design provided that they are compatible for use with the present synchronous detection system. The overall television receiver design may take the form illustrated in U.S. Pat. No. 3,742,130 of William Peil, entitled "Television Receiver Incorporating Synchronous Detection".

The FIG. 2 arrangement is designed for integrated circuit fabrication with the pads P1, P2, P10, P11 and P13 through P16 being the pads of an integrated chip of which the present inventive circuit is a part. Those individual circuit components which lead to the pads along the margins of the circuit diagram are thus the non-integrable components, such as the filter capacitors, inductors, potentiometers, etc.

Taking up the FIG. 2 arrangement in the same order as the block diagram, the IF filter 11, which is currently a non-integrable component, couples the selected signal through the intermediate frequency transformer IF TI, also non-integrable, to the balanced signal input connections at the pads P1 and P2. The pads P1 and P2 thus are the signal entrance terminals to the chip and the input to the intermediate frequency amplifier 12, which is largely integrated.

The intermediate frequency amplifier is a cascoded differential amplifier having a single emitter follower stage in each of its two input paths and a pair of emitter followers in each of its two output paths. The input emitter follower transistors are transistors Q1 and Q2; the cascoded differential amplifier transistors are Q3, Q5 and Q4, Q6, while the output emitter follower pairs are Q16, Q17 and Q18, Q19.

The amplifier connections are as follows: The pad P1 is led through resistance R1 to the base of Q1 and through the resistance R2 to the base of Q2. A pair of like valued resistances R3 and R4 are serially connected between the bases of Q1 and Q2. Each resistance R3, R4 is respectively shunted by one of a pair of diodes D2 and D1. The diodes have their cathodes connected to the bases of Q1 and Q2 and their anodes connected to the interconnection point of resistances R3 and R4. This interconnection point forms an a.c. ground for the bases of transistors Q1 and Q2. The d.c. potential of this a.c. ground is controlled by its connection to the emitter of transistor Q8, a current injecting transistor whose operation will be subsequently detailed. The emitters of Q1 and Q2 are respectively led to ground through load resistances R5 and R6, respectively. The collectors of Q1 and Q2 are led to a source of moderate (5.5 volts) positive bias potentials. The signal available at the emitters of Q1 and Q2 is connected respectively to the bases of transistors Q3 and Q4 forming the lower rank of the cascoded differential amplifier. The emitters of Q3 and Q4 are joined and led through resistance R7 to ground, thus forming a differential input configuration. In addition, a pair of normally reversely poled diodes D3 and D4 are provided, which also enter into the gain control action, coupled respectively between the collector of Q3 and the base of Q1 and between the collector of Q4 and the base of Q2.

Continuing with the description of the cascoded IF amplifier, the collector of lower rank transistor Q3 is connected to the emitter of cascoded transistor Q5 through a shunt load circuit entering into the gain control action. The load circuit comprises a forward poled diode D11 and resistance R9 in shunt. Similarly, the collector of lower rank transistor Q4 is connected to the emitter of cascoded transistor Q6 through a second shunt circuit comprising a forward pole diode D12 and a shunting resistance R10.

The AGC connections are made to the upper rank transistors Q5, Q6. The bases of transistors Q5 and Q6 are connected together and led serially through first and second resistances R11, R12 to the emitter of AGC control transistor Q11. The junction of resistances R12 and R13 is connected through a diode D5 and resistance R13 to said bias source. The transistor Q11, which has its base coupled to the output of the first AGC detector and its collector connected to the bias source, acts as the buffer stage for application of the AGC control potential from the AGC detector 16 to the bases of transistors Q5, Q6. The diode D5 acts as a clamp to prevent excessive AGC potentials and tends to prevent the voltage at the junction of R11, R12 from exceeding 5 diode drops (3.75 volts) above ground at minimum gain condition. These drops (proceeding toward ground) are as follows: ($V_{D5}$, $V_{BE8}$, $V_{BE1}$, $V_{BE3}$ and $V_{BE7}$). Two advantages of this mode of AGC clamping is that the limiting AGC voltage is unaffected by large reductions in bias supply and is largely self-compensating with temperature.

The output signal of the amplifier is developed at the collectors of the upper rank transistors. The collectors of the transistors Q5 and Q6 are connected respectively through the pads P15 and P16 to a tuned circuit acting as the load and comprising three impedances; an inductor L1, shunted by series connected resistance R33, and capacitor C6. A tap on the inductor L1 is then led through a forward biased diode D13 to the bias source. Resistance R33 is selected to have a value (3.1K) approximately equal to the reactance of C6 (1P$^f$) at 45 megahertz. The resistance selection gives a sloping characteristic which adds a small amount of gain to the lower frequency end of the IF passband with a lesser subtraction at the higher frequency end of the band. While this effect is useful in enhancing the lower region of the passband, a second more important consequence of the circuit occurs at substantially higher frequencies (e.g. 90 MHz), where C1 begins to become more highly conductive. When this occurs, R33 appears as a substantial load to the tuned circuit, and minimizes the tendency of the circuit to go into high frequency oscillation, a tendency not uncommon with high frequency integrated circuit processing.

The internal output signal connections from the cascoded stage to the succeeding pairs of emitter followers are made upon the integrated chip. In particular, the collector of transistor Q5 is connected to the base of emitter follower Q16, whose collector is returned to said bias source and whose emitter is led to ground through a 4,000 ohm load resistance R22. The load resistance of Q16 is connected to the base of the succeeding emitter follower transistor Q17 through a series connected resistance R23. The collector of Q17 is also returned to said bias source. The output of Q17 appears across load resistance R24 which is connected between emitter and ground. One balanced input to the video detector 13 is derived at this emitter. The collector of transistor Q6 is connected to the base of emitter follower transistor Q18 whose collector is connected to said source and whose emitter is led to ground through load resistance R25. The signal is coupled through serial signal resistance R26 to the base of the succeeding cathode follower transistor Q19. The collector of Q17 is also returned to the positive bias source and its emitter is led to ground through load resistance R27. The other input to the video detector 13 is then coupled from the emitter of Q19.

The intermediate frequency amplifier circuit is a cascoded amplifier wherein the principal voltage gain occurs in the four cascoded transistors Q3, Q5 and Q4, Q6 and wherein some power gain occurs in the emitter followers Q16, Q17 and Q18, Q19. The cascoded stages provide approximately 48 db of forward gain in the total circuit and 54 db of gain is withdrawn from these stages. The maximum amount of gain that could be withdrawn at this point could be substantially larger (>70 db), but in the interest of an optimum noise figure, intermodulation effect and other performance parameters, it is preferable to withdraw the additional gain from the tuner.

The gain withdrawal from the IF amplifier is achieved by application of the gain control voltage through AGC buffer stage Q11 to the bases of Q5, Q6. Gain control reduction entails the three modes of operation illustrated in simplified schematic form in FIGS. 3(a), 3(b) and 3(c). The control action entails the operation of the diodes D11, D12 and their associated circuitry which act primarily upon the upper rank of cascoded transistors and two other paired diode configurations (D3, D4 and D1, D2), which act primarily upon the lower rank transistors. The sequencing of these gain control mechanisms is provided by a control network, which senses emitter current in the lower rank and which introduces additional current into branches on the path interconnecting the upper and lower rank transistors designed to stabilize the emitter current in the lower rank. The connection and operation of the control network will be taken up after a description of the gain control mechanisms per se.

In the absence of gain reducing AGC potentials at the bases of upper rank transistors Q5, Q6, the base potentials of Q5, Q6 are high, as are the emitter potentials, which tend to follow the base potentials. Under these conditions, the input junctions of Q5, Q6 are forward biased and the diodes D11, D12 are also forward biased. Their anodes are coupled to the emitters of Q5, Q6 and their cathodes are coupled directly to the collectors of Q3, Q4. Their cathodes are also connected through R61, R62 to the emitter of Q20 which is a portion of the control network and which injects additional current into the connection when the collector voltage of Q3, Q4 begins to fall. When D11, D12 are forwardly biased, the upper stages have a minimum degenerative emitter resistance, consisting primarily of the small forward resistance (approximately 20 ohms) of the diodes. Under these conditions, the gain of the cascoded amplifier is maximum at approximately 48 db.

When the AGC control voltage begins to drop, the diodes D11, D12 lose their forward bias and initiate gain reduction in the upper rank transistors. A reduction in the potentials at the bases of Q5, Q6 causes the voltage at the emitters of Q5, Q6 and the anodes of the diodes D11, D12, coupled to the emitters, to fall correspondingly. The cathode potentials of the diodes D11, D12 tend to be sustained initially at the prior value by current supplied from Q20 through R61, R62, proportioned to hold current into Q3, Q4 steady. In the initial gain reduction the bases of Q5, Q6 go from +5 diode drops to +4 diode drops above ground and the anodes of diodes D11, D12 go from +4 diode drops to +3 diode drops above ground. The cathodes of diodes D11, D12 correspondingly go from +3 to +2 diode drops above ground. In the process, diodes D11, D12 lose their forward bias. As they become nonconductive, the resistances R9 and R10 in the emitter paths of Q5, Q6 are no longer shunted by the low forward resistance of forward biased diodes, and introduce a first gain reducing degeneration of the upper rank transistors.

When gain withdrawal from the upper rank transistors Q5, Q6 is complete, gain withdrawal is initiated from the lower rank transistors Q3, Q4.

As previously noted, diode pairs D3, D4 and D1, D2 influence the gain of the lower rank transistors. Diodes D3, D4 have their cathodes connected respectively to the collectors of Q3, Q4, while their anodes are coupled to the bases of Q1, Q2. When the lower rank is at maximum gain, the diodes D3, D4 are reversely biased and exhibit a parasitic capacity illustrated by the dotted lines CD3, CD4. This capacity provides a small and essentially negligible degenerative feedback (corresponding to 3,000 ohms capacitive reactance). Under AGC gain reduction the diodes D3, D4 are forced into forward conduction. When this occurs their negative feedback impedance changes to a resistance of a few tens of ohms, forcing a substantial reduction in gain in the lower rank amplifiers.

Similarly, the diodes D1 and D2 have an influence upon the gain of the overall amplifier. Their influence may be regarded as affecting the division of the signal at the base of emitter follower transistor Q1 and Q2. Assuming an initially reversed bias condition, the diodes D1, D2 present a high impedance shunting the input junction of emitter followers Q1 and Q2. The 4.3K input resistances R3 and R4, which shunt diodes D1, D2 are small enough to permit small amounts of current for stabilization of the control network and yet are sufficiently high to avoid loading the input circuit with respect to input signals. Under AGC reduction, the diodes D1, D2 become forward biased and forward conduction ensues. Under this condition, the input signal voltage divides between the series resistances R1, R2 (150 ohms) and the relatively low impedance (20 ohms) of the forwardly conducting diodes D1, D2. The effect is to reduce the gain of the composite lower rank configuration. The impedance is also low enough to permit large d.c. current flows into the control network.

In the gain reduction involving the diode pairs (D1, D2) (D3, D4), the base of Q7 continues to remain at +1 diode drop above ground; the bases of Q3, Q4 continue to remain at +2 diode drops above ground; and the bases of Q1, Q2 continue to remain at +3 diode drops above ground. These three points were not affected during the initial gain reduction either. The voltage changes occur at the emitter of Q8 whose voltage increases from +3 to +4 diode drops above ground, at the base of Q8 which increases from +4 to +5 diode drops above ground, and finally at the emitter of Q20 which goes from +3 to +4 diode drops above ground. If these voltages are traced to the diode terminals, it may be seen that the diode pairs (D1, D2 and D3, D4) become forwardly biased.

Since the overall gain reduction of the lower portion of the amplifier (Q1, Q2, Q3, Q4) is a function of the feedback ratio, the changes in conductivity of the diodes D1, D2 and D3, D4 strictly do not operate independently, but interact. This is generally suggested by FIG. 3(c) wherein the resistances of the diodes D2 and D3 form serial elements of a voltage divider applying the negative feedback voltage from the collector of Q3 to the base of Q1.

Approximate calculations indicate the following gain in the three conditions of operation. Under maximum gain, a voltage gain of about 48 db is achieved:

$$V_g = G_m R_L = 0.1 \times 2.5K = 250$$

where $G_m = 0.1$ $\mu$mos $R_L = 2.5K$ ohms

The equivalent gain configuration for one branch of the cascoded amplifier at maximum gain is illustrated in FIG. 3(a). At maximum gain, both stages Q3 and Q5 are operating at maximum gain, diodes D11, D12 are in a forward conduction state, while diodes D3, D4 and D1, D2 are in a back biased condition.

At intermediate gain, the diodes D11 and D12 are no longer forward biased since the AGC potential applied to the bases of Q5, Q6 falls, forcing the emitters of Q5, Q6 to fall, and the voltage available across R9, R10 to be insufficient to maintain forward diode conduction. With D11, D12 non-conducting, the degenerative emitter resistance is 540 ohms. This produces the configuration shown in FIG. 3(b) and a gain reduction of about 9 db:

$$V_g = r_f/r_i \times 2.5K/0.54K = 3,000/156 \times 2.5K/5.4K = 92$$

$$= 39 \text{ db}$$

Where $r_f$ is the impedance of the capacitance of diode D3 (CD3)

$r_i$ = input resistance 150 ohms (R1, R2) 2.5K is the virtual load impedance of the cascoded stage, and 540 ohms is the emitter resistance (R9, R10)

As the AGC continues to depress the base voltage on Q5, the diode pairs D3, D4 and D1, D2 both previously back biased, now begin to conduct. The minimum gain configuration is shown in FIG. 3(c):

$$V_g = 7/150 \times 2.5K/0.54K = 0.21 = -14 \text{ db}$$

The sequencing of the gain control mechanisms outlined above is provided by a control network whose connections and operations will now be described. Gain control, as shown in FIG. 1, is applied to both the IF amplifier 12 and the tuner 10. The control network includes means for sensing the emitter current in the lower rank transistors Q3, Q4, an amplifier for providing an amplified indication of any change in such emitter current, and stabilizing circuitry including two current injecting means that generally oppose any such change in emitter current. The effect of the control network is to cause the first phase of gain reduction to be completed before the second is initiated. For control of the tuner, means are provided for sensing the current in diodes D3, D4 which flows in the emitter (and collector) of Q8, and which is indicative of the gain withdrawal from the IF amplifier.

The emitter current sensing is provided by resistance R7 which is coupled between the emitters of Q3, Q4 and ground and which generates a voltage drop proportional to that emitter current. The voltage drop in R7 is applied through resistance R8 to the base of the amplifier Q7. Amplifier Q7 has its emitter grounded and its collector led through load resistance R13 to a suitable bias source. An amplified indication of emitter current in Q3, Q4 appears at the collector of amplifier Q7, and is coupled to the bases of current injecting transistors Q20 and Q8. Transistor Q20, whose connections have been previously detailed, is designed to supply an initial current through resistances R61 and R62. The current from Q20 acts to make up for any reduction in current flowing from the emitters of upper rank transistors Q5 and Q6. Absent such an injection of additional current from Q20, a gain reduction which reduces the emitter current in upper rank transistors Q5 and Q6, would cause a corresponding diminution in the current available for lower rank transistors Q3 and Q4. Thus, current injection from Q20 tends to sustain the emitter currents in Q3 and Q4 at a constant value.

The second current injection path in the control network is through the transistor Q8 whose connections have been only partially detailed. As previously noted, the emitter of Q8 is coupled to the floating ground in the input circuit of the emitter followers Q1 and Q2. The anodes of the diodes D1 and D2 are returned to this point. Thus, since their junctions are all poled in the same direction, a pair of potentially low impedance paths are provided sequentially through the input junction of Q8, diodes D1, D2, diodes D3, D4, for the injection of current into the path to the collectors of Q3, Q4.

Continuing with the connections to transistor Q8, its base is coupled to the output of Q7 for increasing conduction when Q7 responding to emitter current variation indicates the need for additional current injection. The collector of Q8 is coupled through a load resistance R14 and diode D6 to a positive bias source for the supply of current to Q8. The collector of Q8, as will be described, is also the point for the application of a control signal to the tuner 10.

The two paths provided through the input junction of Q8 and the two diode pairs (D1, D2, D3, D4) may be opened to current flow upon the occurrence of two events. The collector potential of Q3, Q4 must fall and the base potential of Q8 must rise to a suitably high potential to permit diode pairs D1, D2, and D3, D4 to be forwardly biased and the input emitter of Q8 to be biased on. Conduction in these paths normally occurs when the current injection from Q20 approaches one and a half milliampere, and the voltage drop in R61, R62 exceeds two diode drops.

Prior to such conduction, Q8 acts to stabilize the Veb of emitter followers Q1, Q2, and consequentially the emitter current of Q3, Q4, against small variations. Full conduction and current injection by Q8 through the diode pairs is then delayed through the period that diode D11, D12 is gradually being un-biased and R9 is becoming effective. Once D11, D12 are completely unbiased, conduction in the path through diodes D1, D2 and D3, D4 is allowed to occur, and the second stage of gain reduction begins. The reason for this separation of gain reduction functions is to reduce amplifier non-linearity, as would occur if more than one diode pair were at the knees of their conduction curves at the same time.

The onset of full current flow through Q8 produces equal currents through its input and output junctions and both initiates and indicates the second stage of gain reduction. The input junction current being injected through the first diode pairs D1, D2 and D3, D4 initiates the gain reduction for reasons noted earlier. The current flow through these diodes also contribute to sustaining the emitter current of Q3, Q4 at the levels required for linear input signal operation. At the same time that large current flows through the input junction are taking place, output current of equal value is produced in the output junction of Q8. This output current is then applied to the tuner to indicate that gain reduction in the lower rank transistors is now underway and becomes the signal for introducing gain control action to the tuner.

To effectuate gain control of the tuner, the collector Q8 is connected through resistance R15 to the emitter of a second AGC buffer amplifier Q9. The base of Q9 is coupled to the positive bias source and its collector is coupled through R16 to the emitter of a second threshold transistor Q10. The emitter of Q10 is led to a high positive potential (+15 volts) through resistance R17. The base of Q10 is coupled through pad P10 to a variable voltage source comprising the voltage divider resistances (R30, R31, R37). The collector of Q10 is coupled through pad P11 to a second AGC filter comprising resistance R33, shunt capacitor C3 and a level setting resistance R32 coupled to a −10 volts of bias source. The filtered AGC voltage is derived from the capacitor C3 and applied to control the gain of the tuner 10, once the threshold setting is exceeded.

The circuit comprising transistor Q9, resistances R14, R15, R16 and diode D6 forms a current level shifting stage. Since the resistance R15 in the emitter path of Q9 is 11 times as great as resistance R14, the current division into the emitter of Q9 as a result of change in collector current in Q8 is approximately 1 to 11. This permits rather large current flows in Q8, without an adverse affect upon the tuner 10. The setting of the threshold of Q10 permits the withdrawal of gain from the tuner to commence at any point after the lower rank transistors are subject to control. Normally the withdrawal of gain from the tuner is set to occur in time to hold non-linearity in the input circuits to a desired minimum, and in particular to hold the input signals to levels which are not only small enough in relation to the currents in diodes D1, D2 to avoid switching, but small enough to avoid non-linearity in general.

The foregoing AGC arrangement has excellent performance in respect to noise figure, noise quieting, dynamic range, intermodulation and accurate delayed AGC control of the tuner. The improvement in noise quieting is to 55 db over prior figures of 40 db with comparable prototype equipment. The available dynamic range approaches 70 db for the AGC amplifier alone, since it relies on three different control mechanisms. Normally, only 48 db of gain control are required, with the balance of the AGC control range being taken from the tuner. The intermodulation performance is excellent since the gain is successively withdrawn from the highest level stages back to the lowest level stages. This avoids driving any of the stages at a higher level that can be accommodated. Furthermore, the control network also helps to avoid intermodulation effects by preventing the interaction between gain withdrawal from the upper and lower stages of the cascoded amplifier. The control network prevents simultaneous gain withdrawal from these two diode dependent effects. Furthermore, the control network provides a means for accurate gain withdrawal from the tuner. As gain withdrawal from the lower rank stages takes place, a clear indication of the amount of gain withdrawal is provided by the state of conduction of the control network. Gain withdrawal may then be initiated from the tuner in response to the state of conduction of the control network. Proper adjustment of the second threshold, responding to conduction in the control network, permits one to introduce enough gain reduction into the tuner to prevent overloading the cascoded IF stage.

What I claim as new and desire to secure by Letters Patent of The United States is:

1. An amplifier of controllable gain comprising:

a. a first pair of transistors each having base, emitter and collector electrodes connected in emitter follower configuration, and having an input circuit for differentially applying the input signal to the bases thereof with the output signal appearing differentially at the emitters thereof, b. a second pair of transistors each having base, emitter and collector electrodes connected in differential amplifier configuration, each having a base d.c. coupled to an emitter of one of said first pair of transistors; and each having a load circuit including a first forward poled diode and resistance in shunt therewith coupled to each collector, c. a third pair of transistors each having base, emitter and collector electrodes connected in cascode with said second transistor pair, each emitter of said third pair being d.c. coupled through one of said load circuits to a collector of said second pair in a current path branched at said collector; the output signal appearing differentially at the collectors of said third pair, d. a feedback circuit for the associated transistors of said first and second pairs including a second diode pair, each diode being connected between the collector of a transistor of said second pair and the base of the associated one of said first pair of transistors and forming a first one of said collector connected branches, the diodes of said second pair being normally reversely poled, said input circuit providing a low impedance path for forward current through said second diode pair, e. means for coupling a gain control voltage to the bases of said third transistor pair for reducing the emitter current of said third transistor pair and by emitter follower action, reducing the collector voltage of said second transistor pair, and f. control means for sequentially reducing the forward bias of said first diode pair to cause gain reducing degeneration in said third transistor pair, and next for forward biasing said second, normally reversely poled second diode pair to cause gain reducing degeneration in said first and second transistor pairs as said gain control voltage increases.

2. An amplifier of controllable gain as set forth in claim 1, wherein said control means includes means for stabilizing the emitter current in said second transistor pair as gain is reduced, sand means comprising:

a. a current sensing resistance coupled in the emitter path of said second transistor pair, b. a current sensing transistor amplifier having its base coupled to said resistance, and producing an amplified indication of the emitter current in said second transistor pair, and c. stabilizing means responsive to said amplified current indication for stabilizing the voltage at the bases of said first transistor pair and for injecting current into a collector connected branch of each transistor of said second pair to stabilize the emitter current in said second transistor pair against reductions in emitter current of said third transistor pair.

3. The combination set forth in claim 2 wherein said stabilizing means comprises a first current injecting transistor in emitter follower configuration, whose base is coupled to the output of said current sensing transistor amplifier, and whose emitter id d.c. coupled to the collectors of said second transistor pair.

4. The combination set forth in claim 3 wherein:

a. said input circuit is a double ended input circuit comprising a resistance serially connected in each signal path and a second pair of serially connected resistors and a third pair of serially connected diodes, with one like electrode of one diode connected to a like electrode of the other diode, said last recited resistpr pair and said third diode pair shunting the bases of said first transistor pair and being joined at their interconnection points to form an a.c. ground of variable d.c. potential for said first transistor pair, and wherein b. said stabilizing means further includes a second current injecting transistor, in base input configuration, whose emitter is coupled to said a.c. ground; the input junction of said current injecting transistor, said second diode pair and said third diode pair being similarly poled for substantial serial current flow, whereby upon application of a predetermined gain control voltage which reduces the collector potential of said second pair of transistors that forward bias to said second diode pair is provided, such that said second diode pair, said third diode pair, and said current injecting transistor become simultaneously conductive to provide additional current into a collector connected branch of each transistor of said second pair.

5. The combination set forth in claim 4 wherein said first current injecting transistor is adjusted to inject current into said branch prior to current injection from said second current injecting transistor, whereby the forward bias of said first diode pair is removed prior to forward biasing of said second diode pair to cause gain reduction in said upper rank transistors to be completed before gain reduction in said lower rank transistors is initiated.

6. The combination set forth in claim 4 wherein said last recited resistor pair has like resistance values, proportioned to provide a small input signal loading to permit high gain operation of said lower rank transistor pair when said second diode pair are nonconductive, said third diode pair upon becoming conductive simultaneously with said second diode pair, causing an increase in said input signal loading and producing a consequent gain reduction.

7. The combination set forth in claim 6 wherein a. said amplifier of controllable gain is an intermediate frequency amplifier of a television receiver, said combination having in addition thereto b. a tuner, also of controllable gain, connected to be responsive to current from said second current injecting transistor.

8. The combination set forth in claim 7 having in addition thereto a. a first thresholding means responsive to an AGC voltage developed from sensing detected synchronizing pulses in a received television signal for application of a gain control potential to said intermediate frequency amplifier, and wherein b. a second thresholding means is provided for application of a gain control potential to said tuner, said second thresholding means applying a control potential when the current in said second current injecting transistor exceeds a predetermined threshold level corresponding to a predetermined amount of gain withdrawal from the lower rank of said intermediate frequency amplifier.

9. The combination set forth in claim 8 wherein said second thresholding means derives its current from the collector of said second current injecting transistor.

* * * * *

PO-1050
(5/69)

UNITED STATES PATENT OFFICE
CERTIFICATE OF CORRECTION

Patent No. 3,838,210 Dated September 24, 1974

Inventor(s) William Peil

It is certified that error appears in the above-identified patent and that said Letters Patent are hereby corrected as shown below:

In the drawings, Figure 2, the diode D13 connected between the +5.5V bus and the tap on inductor L1 should be reversed:

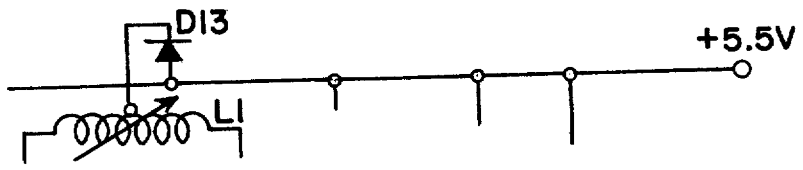

Signed and sealed this 18th day of March 1975.

(SEAL)
Attest:

RUTH C. MASON
Attesting Officer

C. MARSHALL DANN
Commissioner of Patents
and Trademarks